United States Patent
Bernius et al.

(10) Patent No.: US 6,383,664 B2
(45) Date of Patent: *May 7, 2002

(54) ELECTROLUMINESCENT OR PHOTOCELL DEVICE HAVING PROTECTIVE PACKAGING

(75) Inventors: Mark T. Bernius; Edmund P. Woo, both of Midland, MI (US)

(73) Assignee: The Dow Chemical Company, Midland, MI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/309,846

(22) Filed: May 11, 1999

(51) Int. Cl.[7] .............................................. H05B 33/04
(52) U.S. Cl. ....................... 428/690; 313/512; 313/502; 313/504; 313/506; 257/99; 257/100
(58) Field of Search ................ 428/690, 917; 313/502, 504, 506, 512; 257/100, 99

(56) References Cited

U.S. PATENT DOCUMENTS

| 4,769,292 A | | 9/1988 | Tang et al. | |
|---|---|---|---|---|
| 4,839,557 A | * | 6/1989 | Schrank | 313/509 |
| 4,885,211 A | | 12/1989 | Tang et al. | |
| 4,885,221 A | | 12/1989 | Tsuneeda | |
| 5,356,698 A | * | 10/1994 | Kawamoto et al. | 428/209 |
| 5,708,130 A | | 1/1998 | Woo et al. | |
| 5,728,801 A | | 3/1998 | Wu et al. | |
| 5,990,615 A | * | 11/1999 | Sakaguchi et al. | 313/504 |

FOREIGN PATENT DOCUMENTS

| EP | 0 776 147 A1 | 5/1997 | ..................... 33/12 |
|---|---|---|---|
| EP | 0 777 281 | 6/1997 | |
| EP | 0 859 539 A2 | 8/1998 | ...................... 33/4 |
| EP | 0 884 930 A1 | 12/1998 | ..................... 33/22 |
| JP | 05089958 | 9/1993 | ....................... 33/4 |
| JP | 7-14675 | 1/1995 | |
| WO | WO 97/16053 | 5/1997 | |
| WO | WO 97/33193 | 9/1997 | |
| WO | WO 97/46052 | 12/1997 | |

OTHER PUBLICATIONS

Kraft, A. et al., "Electroluminescent Conjugated Polymers–Seeing Polymers in a New Light," *Angew. Chem. Int. Ed.*, vol. 37, pp. 402–428, 1998.

Nakada, H. et al., "Organic Materials Push EL Displays Into Competition WIth LCDs," *Display Devices*, pp. 29–32, 1998.

Sheats, J. R. et al., "Organic Electroluminescent Devices," *Science*, vol. 273, pp. 884–888, Aug. 16, 1996.

Tang, C. W., "Organic Electroluminescent Materials and Devices," Information Display, pp. 16–19, Oct. 1996.

* cited by examiner

Primary Examiner—Cynthia H. Kelly
Assistant Examiner—Dawn L. Garrett

(57) ABSTRACT

The device of this invention comprises a optoelectronic element, a cover, and an adhesive. The optoelectronic element comprises a substrate bearing an anode, a film comprising an optoelectronic material, and a cathode. The cover comprises a lid and a raised rim which is recessed from the outer edge of the lid. The cover contacts the element so that the film comprising the optoelectronic material is located between the substrate and the lid, and within the region defined by the raised rim. An adhesive, located in a channel defined by the bottom surface of the lid from the outer edge to the rim, the rim, and the top surface of the optoelectronic element outside of the region defined by the rim, serves to attach the cover to the optoelectronic element.

11 Claims, 2 Drawing Sheets

ELECTROLUMINESCENT OR PHOTOCELL DEVICE HAVING PROTECTIVE PACKAGING

This application is under a Government contract with The Department of Commerce Naval Air Warfare Center Program, Project Number N00421-98-3-1187.

FIELD OF THE INVENTION

This invention relates to devices having an anode, a cathode, and an optoelectronic film between the anode and the cathode. The invention especially relates to such devices where the optoelectronic film comprises an organic optoelectronic material.

BACKGROUND OF THE INVENTION

Optoelectronic devices such as photocells (e.g., photodetectors, photodiodes, photovoltaics) and electroluminescent (EL) elements may formed by sandwiching films comprising optoelectronic materials between electrodes. When an EL device is subjected to an applied voltage, holes injected from the anode and electrons injected from the cathode will combine in the optoelectronic material to form singlet excitons which can undergo radiative decay, liberating light. Conversely, in photocells, light that is incident upon the optoelectronic material is converted into electric current.

Optoelectronic devices have been made with certain inorganic and organic semi-conductors as the optoelectronic materials. In addition, the film comprising the optoelectronic material may comprise a plurality of layers based on materials of the desired properties. Constituent organic optoelectronic materials may be polymeric, as described by Kraft and coworkers in Angew. Chem. Int. Ed., Vol. 37, pp. 402–428, (1998), or monomeric, as described by Tang and VanSlyke in U.S. Pat. No. 4,885,211 and by Tang in Information Display, pp. 16–19, October, 1996. Other suitable materials include those disclosed in U.S. Pat. No. 5,708,130, and 5,728,801, WO97/33193, U.S. patent application Ser. Nos. 09/123,271 and 09/289,344.

The anode is typically a transparent or semi-transparent conducting material, deposited on a transparent substrate, such as glass, so that light can escape from the EL element or so that the optoelectronic film can be exposed to light. Indium-tin-oxide (ITO) is generally the preferred anode material because of its excellent optical transparency and electrical conductivity. Because most organic materials have low electron affinity, efficient injection of electrons into them from the cathode is only possible when the cathode is a metal of low work function which can be deposited as pin-hole-free films by evaporation in high vacuum or by sputtering. Preferred metals are lithium, calcium and magnesium, as well as their alloys and blends with metals of higher work function. The use of low work function metals in EL elements leads to higher EL efficiency but also environmental instability as these metals are known to be extremely sensitive to oxygen and moisture in ambient air. Indeed, EL elements with calcium cathodes have been reported to lose 90% of their efficiency in 37 seconds in a highly humid environment according to Sheats, et al. in Science, Vol. 273, (1996), pp. 884–888. Magnesium is sometimes seen as a compromise choice yet its stability in EL elements still leaves much to be desired as Tang and VanSlyke (U.S. Pat. No. 4,885,211) had shown that efficiency of these elements may drop by more than an order of magnitude in a matter of hours when exposed to an ambience with a relative humidity of 20% or higher due to cathode corrosion. In addition to the cathodes, polymer films in EL or photocell devices must also be protected from ambient oxygen and moisture as the injection of charge carriers generates highly sensitive chemical species: radical anions formed by injection of electrons and radical cations formed by injection of holes into the polymer film are readily destroyed by oxygen and water.

There is clearly a need for an effective packaging scheme to protect EL elements and photocell elements from ambient environment if they are to be used in commercial displays. This need has been recognized and several packaging approaches have been reported.

WO97/46052 teaches the use of a sheet of low melting metal alloys bonded onto the cathode of an EL element. Since the alloy layer is in direct contact with the cathode and, indeed, serves as the wiring contact, this approach is not suitable for EL elements with patterned cathodes, which is the preferred method for creating dot-matrix displays.

Another approach (see EP 777,281, and WO 97/16053) involves coating the cathode first with an organic film which is, in turn, coated with layers of metals, metal oxides, inorganic oxides, or, inorganic fluorides and the like. The problem with this approach is the application of the organic coating onto the cathode. Once an EL element is formed, no part of it may be exposed to moisture, organic solvent, oxygen, and elevated temperatures without causing damage. Thus the application of an organic coating to a formed EL element, possible in principle, would be extremely difficult to accomplish without damaging the EL element in some way.

Yet another approach described in JP 7014675 involves co-forming films which are mixtures of inorganic fluorides and oxides and plasma-polymerized poly-p-xylylene. The inventor acknowledged the inferior barrier (to oxygen and moisture) properties of the polymer vs inorganic materials because of the presence of macro defects. Therefore, diluting the beneficial barrier properties of the inorganic materials with poly-p-xylylene can hardly be an advantage. Furthermore, organic emitting materials are readily damaged by intense ultraviolet light inherent to the plasma generation process. Even if this packaging approach could protect the cathodes from oxygen and moisture in ambient environment, it is likely to cause irreversible damage to the optoelectronic properties of the organic material.

A fourth approach involves sealing the flange of a metal or glass lid with a UV-curable adhesive onto the glass substrate of the EL element in vacuum or in an atmosphere of very dry nitrogen as described by Nakada and Tohma in Display Devices, 1998, pp. 29–32. The dimensions of the lid are chosen such that there is a gap between the inner surface of the lid and the cathode. The adhesive film must provide adhesion between the cover and element and barrier to ingress of moisture and oxygen. Since adhesion and barrier properties result from different chemical designs, it's unlikely for an adhesive to perform well in both functions. Material selection would be a compromise. It is also critical that the adhesive film be free of voids and pinholes and the adhesive be free of volatile organic compounds, dissolved gas, and moisture which would be otherwise trapped in the sealed compartment and will eventually cause device deterioration.

It is clear that all of the known approaches have limitations. It is the object of this invention to provide a simple, yet effective, packaging scheme free of said limitations.

SUMMARY OF THE INVENTION

The device of this invention comprises a optoelectronic element, a cover, and an adhesive. The optoelectronic element comprises a substrate bearing an anode, a film comprising an optoelectronic material, and a cathode. The cover comprises a lid and a raised rim which is recessed from the outer edge of the lid. The cover contacts the element so that the film comprising the optoelectronic material is located between the substrate and the lid, and within the region defined by the raised rim. An adhesive, located in a channel defined by the bottom surface of the lid from the outer edge to the rim, the rim, and the top surface of the optoelectronic element outside of the region defined by the rim, serves to attach the cover to the optoelectronic element.

DETAILED DESCRIPTION OF THE INVENTION

"Optoelectronic material" as used herein means a material which is capable of converting electrical charge to light and vice versa, and optionally whose conductivity is enhanced by exposure to light.

"Optoelectronic element" as used herein means an electroluminescent device, a photocell, or similar devices.

Figure 1A:
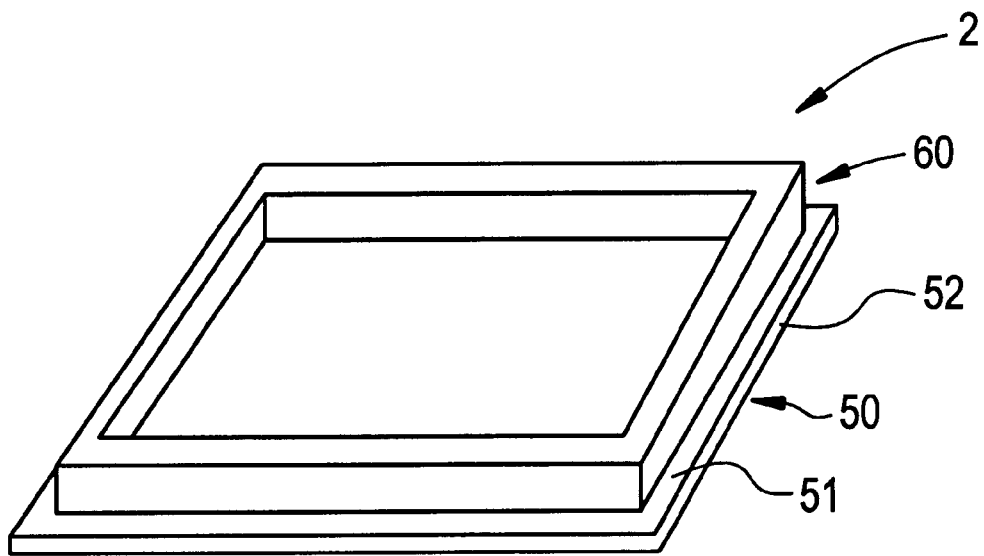
FIG. 1A is a drawing of a representative cover with a raised rim for encapsulating optoelectronic elements; 1B is a cross-sectional view of the representative cover and raised rim.

The invention is further described with reference to the figures. Drawings are not scaled to true dimensions some of which are exaggerated for purpose of clarity. FIG. 1A shows a representative cover 2 having a lid 50 and a raised rim 60 extending from the bottom surface 51 of the lid 50. The rim 60 is recessed from the outer edge 52 of the lid 50.

Figure 2:
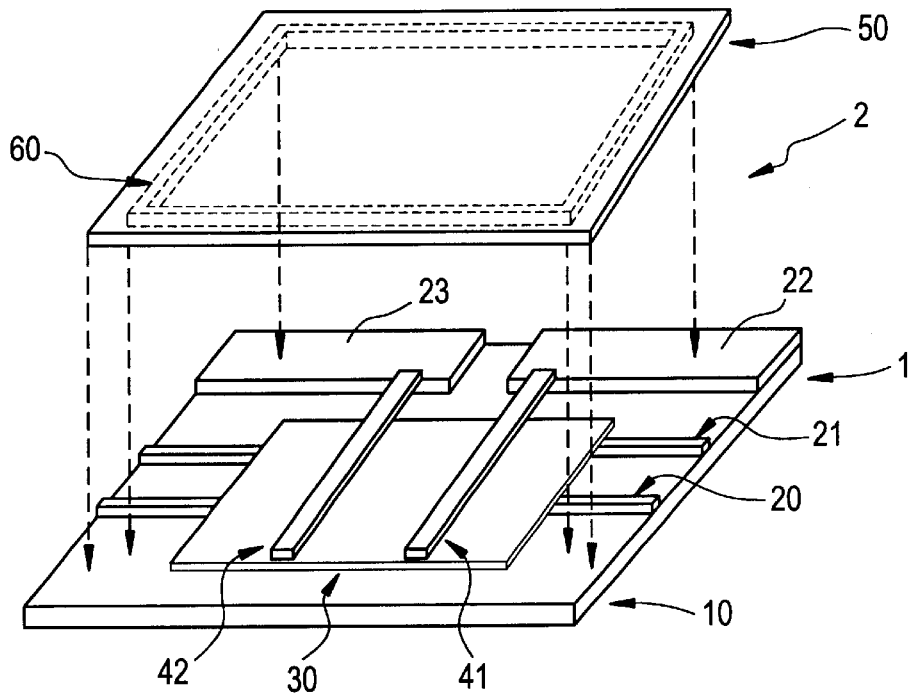
FIG. 2 shows the positioning of a representative cover relative to a representative optoelectronic element.
Figure 3:
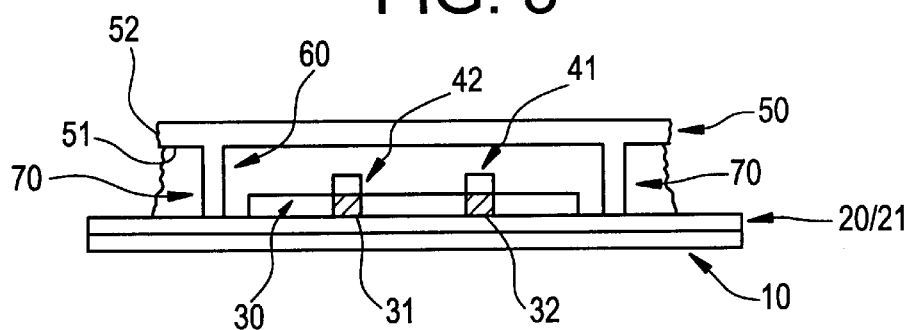
FIG. 3 is a cross section view of FIG. 2 after the cover is attached to the optoelectronic element and sealed with an adhesive.

The optoelectronic element 1 shown in FIGS. 2 and 3 is a 4-pixel electroluminescent element. The element 1 comprises a substrate 10, two strips of anode 20 and 21 on the substrate, optoelectronic material 30 which is electroluminescent and is coated over the anode 20, 21, and the substrate 10, two strips of cathode 41 and 42 over the optoelectronic material 30, the cathode strips are in contact with conducting pads 22 and 23. Alternative means of contacting the anode and cathode to the optoelectronic material may be used. For example, a continuous layer of anode material could be covered by an imagewise distribution of an insulating material, such as a photoresist. The optoelectronic material would then be applied over the anode and the imaged insulating layer. Such a system would provide a luminescent image negative to the image of the insulating material. In addition, other supplementary layers which are known in the art, such as barrier or protective layers, may also be used.

In an electroluminescent device, the conducting pads 22, 23 and the anodes 20, 21 are connected to a voltage source in such a way that the anode is positive relative to the conducting pads. The element then becomes electroluminescent in the area of the optoelectronic material defined by the intersections 31 and 32 of the anodes 20 and 21 with the cathodes 41 and 42. In a photodiode or photodetector, the conducting pads 22, 23 and the anodes 20, 21 are connected to a current collector, a current detector or another device run by the generated electricity.

The substrate 10 for the optoelectronic element 1 is a rigid, and preferably transparent material such as glass or quartz. At least one of the substrate 10 or the lid 50 should be transparent so that light can enter or exit the device. The anode 20, 21 is preferably a transparent or semi-transparent material as is known in the art, such as indium tin oxide (ITO). The thickness of the anode is preferably less than about 1 micron, more preferably less than 0.5 micron and most preferably less than 0.25 micron. The conducting pads may comprise any suitable conductive materials such as an inert metal (e.g. gold) or the material used in the anode (e.g. ITO). The conductive pads preferably have a thickness less than about 1 micron, more preferably less than 0.5 micron and most preferably less than 0.25 micron.

The cathode 41, 42 is typically a metal or metal alloy, having a low work function. Preferred materials include lithium, calcium, magnesium, alloys and blends of such metals with metals of higher work function. Preferably, prior to attachment of the cover, a thin, electrically insulating inorganic film is applied over the cathodes by either thermal evaporation or sputtering. Materials for this insulating film may be selected from among oxides of Ca, Mg, Si, Ge, and Mo, fluorides of Li, Ca or Mg, and nitrides of Si, and Ge. Preferably film thickness is no greater than 0.05 mm and no less than 0.001 mm with the provision that there is maintained a space between the inner surface of the lid and the surface of this film.

The optoelectronic material is preferably an organic charge carrier transporting material. For electroluminescent devices these materials must emit light and for photodiodes these materials must be capable of generating or carrying current when exposed to light. These materials are typically highly conjugated materials and may be monomeric or polymeric. Suitable monomeric materials include, for example, tertiary aromatic amines, metal complexes of 8-hydroxyquinoline, diarylbutadienes, stilbenes, and the like, as disclosed in U.S. Pat. No. 4,769,292 (Tang et al.) and Tang, Information Display, October (1996), pp. 16–19, both of which are incorporated herein by reference. Examples of suitable polymeric materials include polyarylene vinylenes and polyfluorenes. See, e.g., Kraft et al., Angew. Chem. Int. Ed. Vol. 37, pp. 402–428 (1998), U.S. Pat. Nos. 5,708,130, 4,885,211 and 5,728,801, WO 97/33193, U.S. patent application Ser. Nos. 09/123,271 and 09/289,344, all of which are incorporated herein by reference. The film comprising the optoelectronic material may also comprise other materials blended with the optoelectronic material as may be known in the art, such as stabilizers, adhesion promoters, fillers, matrix materials. Alternatively, the film may comprise more than one layer of various materials, which may be other optoelectronic materials or non-optoelectronic materials such as those which provide barrier or protective properties. Other materials or layers added to the film should be chosen so as not to unduly inhibit the light emission or current generating properties of the film.

In the preferred embodiment the rigid transparent substrate 10 bearing at least one transparent anode 20 is coated with the optoelectronic material or its precursor. After forming the layer of the optoelectronic material, the cathode is deposited as a pin-hole-free film by evaporation in high vacuum or by sputtering.

Figure 1B:
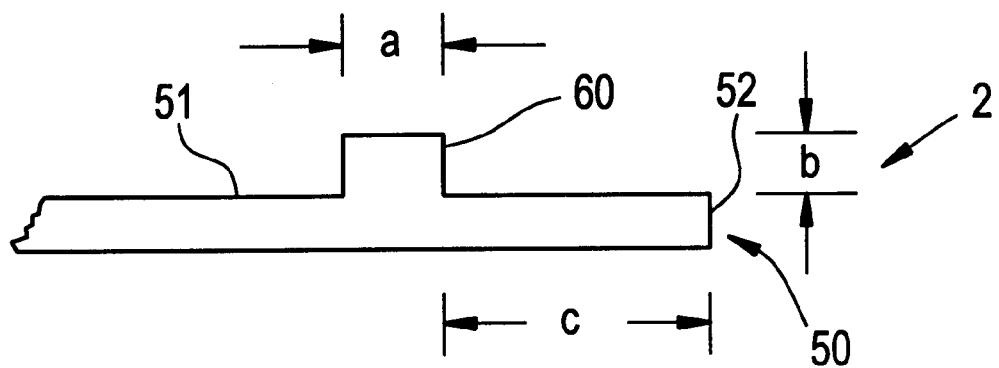

The cover 2 is placed on the optoelectronic element 1 so that the rim 60 contacts the top surface(s) of the element 1. Referring to FIGS. 3 and 1B, the height, b, of the rim 60 is preferably such that there is no contact between the top surface of the optoelectronic element 1 and the lid 50. Such a gap is desirable to protect the surface of the element from damage. The gap preferably has a thickness of at least 1 micron, more preferably at least 2 microns and most preferably at least 5 microns. The cathodes 41 and 42 which are typically located at the top of the element are particularly fragile. The height, b, of the rim 60 is preferably no greater than 3 mm and no less than 0.05 mm for most optoelectronic elements. The width, a, of the rim 60 is preferably no greater than 5 mm and no less than 0.1 mm. The rim 60 is preferably recessed from the outer edge of the lid by a distance, c, no greater than 5 mm and no less than 0.5 mm.

The lid should preferably be fabricated from a rigid material with high barrier properties to oxygen and moisture. Examples of suitable materials include, for example, glass, quartz, ceramic, aluminum, and stainless steel. Commercially available plastics may also be selected if the thus fabricated lid is given a barrier coating prior to use. Barrier coating materials include oxides of aluminum and silicon, and nitrides of silicon and germanium. The lid need not be electrically insulating. However, the rim, or portions of the rim which contact the optoelectronic element should be electrically insulating. The rim may be of the same or different material from the lid. Again, high barrier properties to oxygen and moisture are desired. These barrier properties provide one of the benefits of this invention which is improved oxygen and moisture barrier compared with a lid with no rim which would simply be attached with an adhesive having relatively poor barrier properties. The rim also prevents the adhesive from seeping into the internal portions of the device which could seriously damage the device. For, example, silicon nitride, a high barrier electrically insulating material may be deposited onto a sheet of the lid material by sputtering through a mask to form the rim. Alternatively, the rim may be formed by physical or chemical etching of the lid material, such as glass or the rim may be formed by stamping or machining from a metal sheet, followed by covering the surface of the rim with a layer of electrically insulating film such as aluminum oxide, silicon dioxide, silicon nitride, and the like. The thickness of the lid may vary with material choice. However, the thickness should be such to provide resistance to flexing during handling.

The cover is positioned in a manner to cover the optoelectronic material while leaving portions of at least some of the conductive materials exposed for connections to a power source (for an electroluminescent device) or a current detector or collector (for photodetectors and photodiodes). Preferably the cover also completely covers the relatively fragile cathodes. It may be noted from FIGS. 2 and 3 that there is a very small gap between the rim 60 and the substrate 10 corresponding to the thickness of the bonding pads 22, 23 and/or the anode 20, 21. This gap however is small enough that there is negligible effect on the barrier properties of the packaging of the device as a whole. Moreover, the adhesive, while not having excellent oxygen and moisture barrier properties, does provide some additional protection.

The adhesive is advantageously free or substantially free of volatile organic components and preferably cures at or near room temperatures. UV-curable adhesives and two-component epoxy adhesives having these characteristics would be suitable. The adhesive may be applied by a syringe manually or by an automated dispenser equipped with a fine nozzle, as in many of the commercially available adhesive dispensers, after the cover is put in place.

In one preferred embodiment, the inner surface of the lid is coated with a thin film of reactive metal which serves as a sacrificial "getter" of traces of moisture, oxygen, and other potential harmful contaminants trapped inside the sealed cavity. The getter film is preferably fabricated by thermal evaporation or sputtering preferably of calcium, barium, magnesium, and the like. Since the amount of trapped contaminants should be very low if the sealing is conducted in a dry, inert atmosphere, film thickness need not exceed 0.5 mm with the provision that there is maintained a space between the cathodes and the getter film.

EXAMPLE

This example illustrates the packaging of an EL element whose active area dimensions, defined as the area of the cathode, are approximately 58 mm×40 mm constructed on a piece of ITO-glass of the dimension 75 mm×50 mm. The ITO-glass was coated with a photoresist material which then imagewise was exposed to light and developed to provide an image of an insulating material over the ITO. A layer of organic, polymeric optoelectronic material was then applied over the imaged photoresist and ITO. A 35 nm calcium cathode overcoated with 270 nm of aluminum was then applied by vacuum evaporation.

Figure 4:
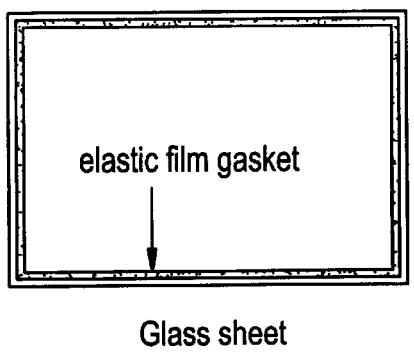
FIG. 4 is a drawing of a glass sheet used in making a representative cover.

The lid was fabricated in the following manner. A rectangular gasket (see FIG. 4) made from an elastic film with outside dimensions of 70 mm×46 mm and uniform width of about 1.5 mm was applied onto a piece of glass 73 mm×50 mm such that the outer edges of the gasket were uniformed recessed from the perimeter of the glass sheet as shown in FIG. 4.

The side of the glass sheet with the gasket was subjected to sand-blasting until the thickness was reduced to about 1.4 mm from the original 1.8 mm. The area covered by the elastic film gasket was not etched by the sandblasting and effectively became the raised rim. The gasket was peeled off and the now completed lid was cleaned and dried.

A 100 nm film of barium was vacuum deposited onto the inside cavity formed by the raised rim. This serves as the "getter". In an inert atmosphere the EL element and the lid were then positioned together as shown in FIGS. 2 and 3. While clamped firmed to maintain the alignment of the lid and the EL element, a UV adhesive (Nordland Optical Adhesive 88 from Nordland Corp., New Brunswick, N.J.) was applied by a syringe in the manner already described. The adhesive was cured by UV light for 3 seconds from a light source Dymax Light Welder PC3, 2.5 watt/cm$^2$, 320–390 nm from Dymax Corp., Torrington, Conn. The packaged device can be operated and/or stored in ambient air for long periods of time (at least several weeks) without discernable degradation of luminance as determined by visual inspection. The device was still functioning at the time of filing of this application.

What is claimed is:

1. A device comprising:
    (a) a optoelectronic element comprising (i) a substrate, (ii) a film comprising an optoelectronic material on a side of the substrate, and (iii) an anode and a cathode each of which are in contact with the film comprising the optoelectronic material and are separated from each other, wherein the side of the substrate bearing the film comprising the optoelectronic material, the film comprising optoelectronic material, the anode and the cathode define a top surface of the optoelectronic element,
    (b) a cover comprising (i) a lid having a bottom surface, and an outer edge, and (ii) a rim extending from the bottom surface of the lid, recessed from the outer edge of the lid, and defining a region circumscribed by the rim, wherein the rim contacts the top surface of the optoelectronic element so that the optoelectronic material is within the region defined by the rim, and (c) an adhesive located in a channel defined by (i) the bottom surface of the lid between the outer edge and the rim, (ii) the rim, and (iii) the top surface of the optoelectronic element not within the region circumscribed by the rim.

2. The device of claim 1 wherein the optoelectronic material is a luminescent organic compound.

3. The device of claim 2 wherein the luminescent organic compound is a polymer.

4. The device of claim 1 wherein the optoelectronic material conducts current when exposed to light.

5. The device of claim 1 wherein the optoelectronic material is sandwiched between the anode and the cathode.

6. The device of claim 1 wherein the cathode comprises a low work function metal.

7. The device of claim 1 wherein there is a thin layer of a getter material on the bottom surface of the lid.

8. The device of claim 1 wherein there is a thin film of an inorganic, insulating material on the cathode.

9. The device of claim 1 wherein the lid comprises a material selected from glass, quartz, ceramic, rigid polymers having a coating of a barrier material, aluminum, and stainless steel.

10. The device of claim 1 wherein the rim comprises a material selected from glass, quartz, ceramic, rigid polymers having a coating of a barrier material, aluminum, and stainless steel, with the proviso that if the material is electrically conducting, the portion of the rim that contacts the element is coated with an electrically insulating material.

11. The device of claim 1 wherein the adhesive is selected from UV-curable adhesive and two-component epoxy adhesives.

* * * * *